(12) United States Patent
Johnson et al.

(10) Patent No.: US 7,842,143 B2
(45) Date of Patent: *Nov. 30, 2010

(54) HYPERELASTIC SHAPE SETTING DEVICES AND FABRICATION METHODS

(75) Inventors: Alfred David Johnson, San Leandro, CA (US); Valery Martynov, San Francisco, CA (US); Michael D. Bokaie, San Rafael, CA (US); George R. Gray, Fremont, CA (US)

(73) Assignee: TiNi Alloy Company, San Leandro, CA (US)

( * ) Notice: Subject to any disclaimer, the term of this patent is extended or adjusted under 35 U.S.C. 154(b) by 229 days.

This patent is subject to a terminal disclaimer.

(21) Appl. No.: 11/949,663

(22) Filed: Dec. 3, 2007

(65) Prior Publication Data
US 2009/0139613 A1 Jun. 4, 2009

(51) Int. Cl.
*C22F 1/08* (2006.01)
(52) U.S. Cl. ..................... 148/562; 148/563
(58) Field of Classification Search .............. None
See application file for complete search history.

(56) References Cited

U.S. PATENT DOCUMENTS

| | | | |
|---|---|---|---|
| 368,425 A | 8/1887 | Ross et al. |
| 538,593 A | 4/1895 | Naylor, Jr. |
| 1,560,335 A | 11/1925 | Czochralski |
| 1,904,828 A | 4/1933 | Green |
| 1,913,035 A | 6/1933 | Loepsinger |
| 1,926,925 A | 9/1933 | Wescott |
| 2,060,593 A | 11/1936 | Schaurte et al. |
| 2,371,614 A | 3/1945 | Graves |
| 2,586,556 A | 2/1952 | Mullikin |
| 2,608,996 A | 9/1952 | Forman |
| 2,610,300 A | 9/1952 | Walton et al. |
| 2,647,017 A | 7/1953 | Coulliette |
| 2,911,504 A | 11/1959 | Cohn |
| 3,229,956 A | 1/1966 | White |
| 3,351,463 A | 11/1967 | Rozner et al. |
| 3,357,432 A | 12/1967 | Sparks |
| 3,400,906 A | 9/1968 | Stocklin |
| 3,408,890 A | 11/1968 | Bochman, Jr. |
| 3,435,823 A | 4/1969 | Edwards |
| 3,445,086 A | 5/1969 | Quinn |
| 3,454,286 A | 7/1969 | Anderson et al. |
| 3,546,996 A | 12/1970 | Grijalva et al. |
| 3,559,641 A | 2/1971 | Lay |
| 3,561,537 A | 2/1971 | Dix et al. |
| 3,613,732 A | 10/1971 | Willson et al. |
| 3,620,212 A | 11/1971 | Fannon, Jr. et al. |
| 3,659,625 A | 5/1972 | Coiner et al. |
| 3,725,835 A | 4/1973 | Hopkins et al. |
| 3,789,838 A | 2/1974 | Fournier et al. |
| 3,849,756 A | 11/1974 | Hickling |
| 3,888,975 A | 6/1975 | Ramwell |
| 3,913,572 A | 10/1975 | Wheeler |
| 3,918,443 A | 11/1975 | Vennard et al. |
| 3,974,844 A | 8/1976 | Pimentel |
| 4,055,955 A | 11/1977 | Johnson |
| 4,063,831 A | 12/1977 | Meuret |
| 4,072,159 A | 2/1978 | Kurosawa |
| 4,096,993 A | 6/1978 | Behr |
| 4,151,064 A | 4/1979 | Kuehnle |
| 4,176,719 A | 12/1979 | Bray |
| 4,177,327 A | 12/1979 | Mathews |
| 4,195,773 A | 4/1980 | Ogden |
| 4,243,963 A | 1/1981 | Jameel et al. |
| 4,265,684 A | 5/1981 | Boll |
| 4,279,790 A | 7/1981 | Nakajima |
| 4,340,049 A | 7/1982 | Munsch |
| 4,485,545 A | 12/1984 | Caverly |
| 4,501,058 A | 2/1985 | Schutzler |
| 4,524,343 A | 6/1985 | Morgan et al. |
| 4,549,717 A | 10/1985 | Dewaegheneire |
| 4,551,974 A | 11/1985 | Yaeger et al. |
| 4,553,393 A | 11/1985 | Ruoff |
| 4,558,715 A | 12/1985 | Walton et al. |
| 4,567,549 A | 1/1986 | Lemme |
| 4,585,209 A | 4/1986 | Aine et al. |
| 4,589,179 A | 5/1986 | Hulting, Jr. |

(Continued)

FOREIGN PATENT DOCUMENTS

EP 0053596 6/1982

(Continued)

OTHER PUBLICATIONS

Johnson, David et al.; U.S. Appl. No. 12/019,553 entitled "Frangible shape memory alloy fire sprinkler valve actuator," filed Jan. 24, 2008.

(Continued)

*Primary Examiner*—George Wyszomierski
(74) *Attorney, Agent, or Firm*—Shay Glenn LLP

(57) ABSTRACT

Shape-setting methods for fabricating devices made of single crystal shape memory alloys. The method include drawing a single crystal of a shape memory alloy from a melt of the alloy. This is followed by heating and quenching the crystal sufficiently rapid to limit the formation of alloy precipitates to an amount which retains hyperelastic composition and properties of the crystal.

5 Claims, 2 Drawing Sheets

U.S. PATENT DOCUMENTS

| | | | |
|---|---|---|---|
| 4,596,483 A | 6/1986 | Gabriel et al. |
| 4,619,284 A | 10/1986 | Delarue et al. |
| 4,654,191 A | 3/1987 | Krieg |
| 4,684,913 A | 8/1987 | Yaeger |
| 4,706,758 A | 11/1987 | Johnson |
| 4,753,465 A | 6/1988 | Dalby |
| 4,821,997 A | 4/1989 | Zdeblick |
| 4,823,607 A | 4/1989 | Howe et al. |
| 4,824,073 A | 4/1989 | Zdeblick |
| 4,848,388 A | 7/1989 | Waldbusser |
| 4,854,797 A | 8/1989 | Gourd |
| 4,864,824 A | 9/1989 | Gabriel et al. |
| 4,893,655 A | 1/1990 | Anderson |
| 4,896,728 A | 1/1990 | Wolff et al. |
| 4,943,032 A | 7/1990 | Zdeblick |
| 5,060,888 A | 10/1991 | Vezain et al. |
| 5,061,137 A | 10/1991 | Gourd |
| 5,061,914 A | 10/1991 | Busch et al. |
| 5,069,419 A | 12/1991 | Jerman |
| 5,072,288 A | 12/1991 | MacDonald et al. |
| 5,102,276 A | 4/1992 | Gourd |
| 5,114,504 A | 5/1992 | AduJudom, II et al. |
| 5,116,252 A | 5/1992 | Hartman |
| 5,117,916 A | 6/1992 | Ohta et al. |
| 5,119,555 A | 6/1992 | Johnson |
| 5,129,753 A | 7/1992 | Wesley et al. |
| 5,160,233 A | 11/1992 | McKinnis |
| 5,190,546 A | 3/1993 | Jervis |
| 5,192,147 A | 3/1993 | McCloskey |
| 5,211,371 A | 5/1993 | Coffee |
| 5,218,998 A | 6/1993 | Bakken et al. |
| 5,245,738 A | 9/1993 | Johnson |
| 5,309,717 A | 5/1994 | Minch |
| 5,312,152 A | 5/1994 | Woebkenberg, Jr. et al. |
| 5,325,880 A | 7/1994 | Johnson et al. |
| 5,344,117 A | 9/1994 | Trah et al. |
| 5,364,046 A | 11/1994 | Dobbs et al. |
| 5,494,113 A | 2/1996 | Polan |
| 5,502,982 A | 4/1996 | Venetucci |
| 5,543,349 A | 8/1996 | Kurtz et al. |
| 5,605,543 A | 2/1997 | Swanson |
| 5,619,177 A | 4/1997 | Johnson et al. |
| 5,622,225 A | 4/1997 | Sundholm |
| 5,640,217 A | 6/1997 | Hautcoeur et al. |
| 5,641,364 A | 6/1997 | Golberg et al. |
| 5,676,356 A | 10/1997 | Ekonen et al. |
| 5,695,504 A | 12/1997 | Gifford, III et al. |
| 5,714,690 A | 2/1998 | Burns et al. |
| 5,722,989 A | 3/1998 | Fitch et al. |
| 5,771,742 A | 6/1998 | Bokaie et al. |
| 5,772,378 A | 6/1998 | Keto-Tokoi |
| 5,796,152 A | 8/1998 | Carr et al. |
| 5,819,749 A | 10/1998 | Lee et al. |
| 5,825,275 A | 10/1998 | Wuttig et al. |
| 5,837,394 A | 11/1998 | Schumm, Jr. |
| 5,840,199 A | 11/1998 | Warren |
| 5,850,837 A | 12/1998 | Shiroyama et al. |
| 5,867,302 A | 2/1999 | Fleming |
| 5,903,099 A | 5/1999 | Johnson et al. |
| 5,916,178 A | 6/1999 | Noone et al. |
| 5,924,492 A | 7/1999 | Kikuchi et al. |
| 5,930,651 A | 7/1999 | Terasawa |
| 5,960,812 A | 10/1999 | Johnson |
| 6,042,553 A | 3/2000 | Solar et al. |
| 6,072,617 A | 6/2000 | Henck |
| 6,073,700 A | 6/2000 | Tsuji et al. |
| 6,075,239 A | 6/2000 | Aksyuk et al. |
| 6,080,160 A | 6/2000 | Chen |
| 6,084,849 A | 7/2000 | Durig et al. |
| 6,101,164 A | 8/2000 | Kado et al. |
| 6,110,204 A | 8/2000 | Lazarov et al. |
| 6,124,523 A | 9/2000 | Banas et al. |
| 6,126,371 A | 10/2000 | McCloskey |
| 6,139,143 A | 10/2000 | Brune et al. |
| 6,195,478 B1 | 2/2001 | Fouquet |
| 6,203,715 B1 | 3/2001 | Kim et al. |
| 6,229,640 B1 | 5/2001 | Zhang |
| 6,247,493 B1 | 6/2001 | Henderson |
| 6,277,133 B1 | 8/2001 | Kanesaka |
| 6,284,067 B1 | 9/2001 | Schwartz et al. |
| 6,358,380 B1 | 3/2002 | Mann et al. |
| 6,386,507 B2 | 5/2002 | Dhuler et al. |
| 6,406,605 B1 | 6/2002 | Moles |
| 6,407,478 B1 | 6/2002 | Wood et al. |
| 6,410,360 B1 | 6/2002 | Steenberge |
| 6,447,478 B1 | 9/2002 | Maynard |
| 6,451,668 B1 | 9/2002 | Neumeier et al. |
| 6,454,913 B1 | 9/2002 | Rasmussen et al. |
| 6,470,108 B1 | 10/2002 | Johnson |
| 6,475,261 B1 | 11/2002 | Matsumoto et al. |
| 6,524,322 B1 | 2/2003 | Berreklouw |
| 6,533,905 B2 | 3/2003 | Johnson et al. |
| 6,537,310 B1 | 3/2003 | Palmaz et al. |
| 6,582,985 B2 | 6/2003 | Cabuz et al. |
| 6,592,724 B1 | 7/2003 | Rasmussen et al. |
| 6,596,102 B2 * | 7/2003 | Homma ..................... 148/561 |
| 6,605,111 B2 | 8/2003 | Bose et al. |
| 6,614,570 B2 | 9/2003 | Johnson et al. |
| 6,620,634 B2 | 9/2003 | Johnson et al. |
| 6,624,730 B2 | 9/2003 | Johnson et al. |
| 6,669,794 B1 | 12/2003 | Bellouard et al. |
| 6,669,795 B2 | 12/2003 | Johnson et al. |
| 6,672,502 B1 | 1/2004 | Paul et al. |
| 6,688,828 B1 | 2/2004 | Post |
| 6,729,599 B2 | 5/2004 | Johnson |
| 6,742,761 B2 | 6/2004 | Johnson et al. |
| 6,746,890 B2 | 6/2004 | Gupta et al. |
| 6,771,445 B1 | 8/2004 | Hamann et al. |
| 6,790,298 B2 | 9/2004 | Johnson et al. |
| 6,811,910 B2 | 11/2004 | Tsai et al. |
| 6,840,329 B2 | 1/2005 | Kikuchi et al. |
| 6,843,465 B1 | 1/2005 | Scott |
| 6,908,275 B2 | 6/2005 | Nelson et al. |
| 6,920,966 B2 | 7/2005 | Buchele et al. |
| 6,955,187 B1 | 10/2005 | Johnson |
| 7,040,323 B1 | 5/2006 | Menchaca et al. |
| 7,044,596 B2 | 5/2006 | Park |
| 7,073,504 B2 | 7/2006 | Callister et al. |
| 7,084,726 B2 | 8/2006 | Gupta et al. |
| 7,201,367 B2 | 4/2007 | Wietharn |
| 7,441,888 B1 * | 10/2008 | Johnson ..................... 351/41 |
| 2001/0023010 A1 | 9/2001 | Yamada et al. |
| 2002/0018325 A1 | 2/2002 | Nakatani et al. |
| 2002/0062154 A1 | 5/2002 | Ayers |
| 2002/0106614 A1 | 8/2002 | Prince et al. |
| 2003/0002994 A1 | 1/2003 | Johnson et al. |
| 2003/0078465 A1 | 4/2003 | Pai et al. |
| 2003/0170130 A1 | 9/2003 | Johnson |
| 2004/0083006 A1 | 4/2004 | Ellingsen |
| 2004/0200551 A1 | 10/2004 | Brhel et al. |
| 2004/0221614 A1 * | 11/2004 | Holemans et al. ............... 63/35 |
| 2004/0243219 A1 | 12/2004 | Fischer et al. |
| 2004/0249399 A1 | 12/2004 | Cinquin et al. |
| 2005/0113933 A1 | 5/2005 | Carter et al. |
| 2006/0118210 A1 | 6/2006 | Johnson |
| 2006/0213522 A1 | 9/2006 | Menchaca et al. |
| 2006/0232374 A1 | 10/2006 | Johnson |
| 2007/0137740 A1 | 6/2007 | Johnson et al. |
| 2007/0207321 A1 | 9/2007 | Abe et al. |
| 2007/0246233 A1 | 10/2007 | Johnson |

2009/0183986 A1    7/2009  Johnson et al.

FOREIGN PATENT DOCUMENTS

| | | |
|---|---|---|
| EP | 0310439 | 4/1989 |
| EP | 1122526 | 8/2001 |
| EP | 1238600 | 9/2002 |
| GB | 2187951 | 9/1987 |
| JP | 57161031 | 10/1982 |
| JP | 59179771 | 10/1984 |
| JP | 07090624 | 4/1995 |
| JP | 10173306 | 6/1998 |
| JP | 2000185999 A | 7/2000 |
| SU | 1434314 | 10/1988 |
| WO | WO98/53362 | 11/1998 |
| WO | WO99/16387 A1 | 4/1999 |
| WO | WO99/62432 | 12/1999 |
| WO | WO00/04204 | 1/2000 |
| WO | WO03/052150 | 6/2003 |
| WO | WO2005/108635 | 11/2005 |
| WO | WO2006/019943 | 2/2006 |

OTHER PUBLICATIONS

Johnson, Alfred David; U.S. Appl. No. 12/325,722 entitled "Biocompatible copper-based single-crystal shape memory alloys," filed Dec. 1, 2008.

Antonov et al.; New advances and developments in the Stepnakov method for the growth of shaped crystals; Crystallography Reports; vol. 47; Suppl. 1; 2002; pp. S43-S52.

ElastametTM brochure from New Discovery Metals; 2007.

ElastametTM website screen capture, accessed Jul. 23, 2008.

Fu et al.; The growth characteristics with a shape memory effect; J. Phys.: Condens. Matter; vol. 4; 1992; pp. 8303-8310.

Morgan; Medical shape memory alloy applications—the market and its products; Materials Science and engineering A 378; 2004; pp. 16-23.

Qingfu et al.; Stabilisation of martensite during training of Cu-Al-Ni single crystals; Journal de Physique IV; Collloqu C2; Supplement to the Journa de Physique III; vol. 5; Feb. 1995; pp. 181-186.

Recarte et al.; Influence of Al and Ni concentration on the martensitic transformation in Cu-Al-Ni shape-memory alloys; Metallurgical and MaterialsTransactions A; vol. 33A; Aug. 2002; pp. 2581-2591.

Sittner et al.; Stress induced martensitic transformations in tension/torsion of CuAlNi single crystal tube; Scripta Materialia; vol. 48; 2003; pp. 1153-1159.

Sutuo et al.; Development of medical guide wire of Cu-Al-Mn-base superelastic alloy with functionally graded characteristics; Mater Res Part B: Appl Biomater; vol. 69B; 2004; pp. 64-69.

Zhang et al.; The variant selection criteria in single-crystal CuAlNi shape memory alloys; Smart Mater. Struct.; vol. 9; 2000; pp. 571-581.

Zhdanov et al.; Thermal stresses in tubes, produced from a melt by the Stepanov method, during their colling; Journal of Engineering Physics and Thermophysics; vol. 68; No. 1; 1995; pp. 80-89.

Dario et al.; Shape memory alloy microactuators for minimal invasive surgery; Proceedings of SMST-94 Conference; pp. 427-433; Pacific Grove CA; 1994.

Johnson, A. D.; Vacuum-deposited TiNi shape memory film: Characterization and applications in microdevices; J. Micromech. Microeng.; vol. 1; pp. 34-41; 1991.

Krulevitch et al.; Thin film shape memory alloy microactuators; J. Micromech. Microeng.; vol. 5; No. 4; 26 pgs.; 1996.

Schetky, L.M.; Shape-memory alloys; Scientific American, pp. 74-82; 1979.

Johnson et al.; U.S. Appl. No. 12/503,614 entitled "Sprinkler valve with active actuation," filed Jul. 15, 2009.

Johnson, David et al.; U.S. Appl. No. 10/972,745 entitled "Non-explosive releasable coupling device," filed Oct. 25, 2004.

Xiaogdang, Ma; U.S. Appl. No. 10/972,759 entitled "Magnetic data storage system," filed Oct. 25, 2004.

Johnson, David et al.; U.S. Appl. No. 11/006,501 entitled "Anastomosis device and method," filed Dec. 6, 2004.

Johnson, David et al.; U.S. Appl. No.11/041,185 entitled "Single crystal shape memory alloy devices and methods," filed Jan. 24, 2005.

Johnson, David; U.S. Appl. No. 11/415,885 entitled "Eyeglass frame," filed May 2, 2006.

Johnson, David; U.S. Appl. No. 11/420,157 entitled "Shape memory allow thin film, method of fabrication, and articles of manufacture," filed May 24, 2006.

Johnson, David; U.S. Appl. No. 11/526,138 entitled "Constant load bolt," filed Sep. 22, 2006.

Johnson, David; U.S. Appl. No. 11/859,697 entitled "Constant load fastener," filed Sep. 21, 2007.

Johnson, David et al.; U.S. Appl. No. 11/948,852 entitled "Method of alloying reactive elemental components," filed Nov. 30, 2007.

I. E.Viahhi; Robototechnic Constructions Based on Cu-AL-NI Single Crystal Actuators; Proceedings of Second International Conference on Shape Memory and Superelastic Technologies; 1997; United States.

Pauling, Linus, College Chemistry, second edition, W.H. Freeman and Company, San Francisco, 1955, pp. 81-91.

Buchaillot L. et al., "Thin film of titanium/nickel shape memory alloy for multi-degree of freedom microactuators", Seisan Kenkyu, vol. 51, No. 8, 1999, pp. 22-23.

Johnson A. D. et al., "Application of shape memory alloys: advantages, disadvantages, and limitations", Micromachining and Microfabrication Process Technology VII, Oct. 22-24, 2001, San Francisco, CA, USA, vol. 4557, 2001, pp. 341-351.

Takabayashi et al., "Reversible shape memory alloy film fabricated by RF sputtering", Materials and Manufacturing Processes, vol. 13, No. 2, 1998, pp. 275-286.

Martynov, V., "TiNi thin films for microactuators and microdevices: sputter deposition and processing techniques", Thermec' 2003, Internat'l Conf. on Processing and Manufacturing of Advanced Materials, Jul. 7-11, 2003, Leganes, Madrid, Spain, Materials Science Forum, Jul. 7, 2003 vol. 426-432; pp. 3475-3480.

Johnson, Alfred David; U.S. Appl. No. 12/182,119 entitled "Method and devices for preventing restenosis in cardiovascular stents," filed Jul. 29, 2008.

Christian et al.; The application of shape memory actuators in anthropomorphic upper limb prostheses; Artif. Organs; vol. 27; No. 5; pp. 473-477; 2003.

Gill et al.; Three-Dimensional Thin-Film Shape Memory Alloy Microactuator With Two-Way Effect; Journal of Microelectromechanical Sys.; vol. 11; No. 1; Feb. 2002; pp. 68-77.

* cited by examiner

HYPERELASTIC SHAPE SETTING DEVICES AND FABRICATION METHODS

CROSS-REFERENCE TO PRIOR APPLICATION

This application claims the benefit under 35 USC §119(e) of U.S. provisional application Ser. No. 60/719,110 filed Sep. 22, 2005.

BACKGROUND OF THE INVENTION

1. Field of the Invention

This invention relates to mechanical devices that have a component in which large recoverable distortions are available in non-extruded shapes.

2. Description of the Related Art

Common shape memory alloy (also called SMA) materials such as Nitinol can be shape-set by heating to an annealing temperature while constrained to a shape, and then cooling. For example, a helix may be formed from a straight TiNi wire by winding the wire on a mandrel, securing the ends, heating to 550 deg. C., and cooling. The rates of heating and cooling are not critical in this 'shape-setting' process for TiNi, although special characteristics are achieved by holding the temperature constant at specific temperatures.

OBJECTS OF THE INVENTION

It is a general object of the invention to provide methods for methods for the shape setting fabrication of single crystal shape memory alloys (also called "hyperelastic"), such as CuAlNi and to provide devices made by such methods.

A further object of this invention is to provide new and improved devices made of hyperelastic single crystal SMA by novel methods of shape-setting.

DESCRIPTION OF THE PREFERRED EMBODIMENTS

Hyperelastic alloys formed as single crystals of approximately Cu(84)Al(14)Ni(4) wt. % have enhanced strain recovery properties compared to more conventional polycrystal SMAs such as Nitinol. Such single crystals are formed as extruded shapes whether by pulling from melt or by continuous casting. It is desirable to form other shapes such as helices or bends, but the methodology used for forming Nitinol destroys the single crystallinity; a problem with polycrystal CuAlNi is that it is brittle. Therefore there is a need for methods which avoid these and other problems.

The fabrication and performance of such single crystal SMA materials are disclosed in U.S. application Ser. No. 10/588,412 filed Jul. 31, 2006, the disclosure of which is incorporated by this reference.

Figure 2:
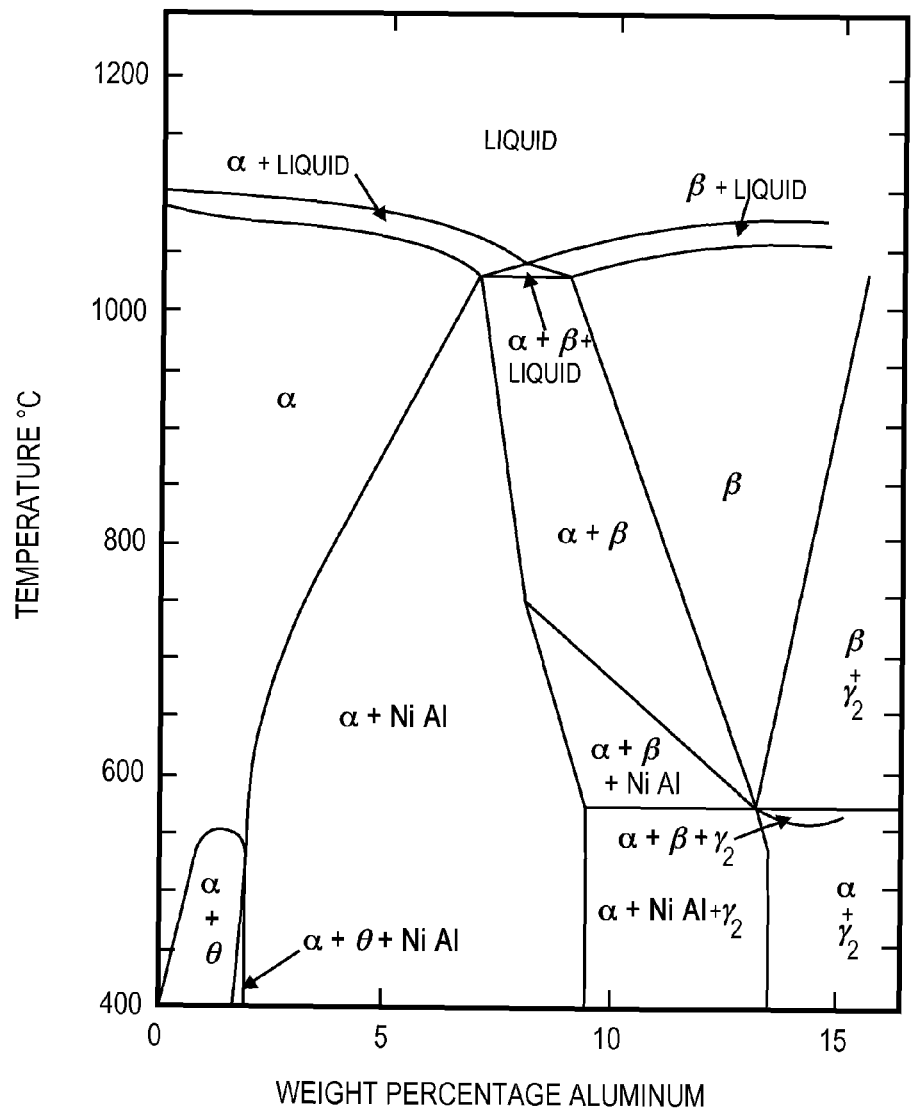
FIG. 2 is a phase diagram of CuAlNi in which the Ni is 3 weight %.

Single-crystal CuAlNi is drawn from melt and cooled by use of the Stepanov method. As the single crystal cools, precipitates form so that strength, shape memory, and hyperelastic properties are not optimal. Imparting shape memory and hyperelastic properties requires heating to a temperature high enough to dissolve the precipitates, followed immediately by rapid cooling ("quenching") to lock in the dissolved elemental components. Methods used for producing single crystal shape memory alloys generally produce net shapes in the crystal. FIG. 2 shows the phase diagram of CuAlNi in which the Ni is 3 weight %.

Use of elevated temperature to modify the shape of hyperelastic single crystal of CuAlNi normally results in loss of single crystallinity: at elevated temperatures precipitation of elemental components (especially Al) changes the composition. For this reason actuators and flexures designed to exploit the extraordinary strain recovery of these materials (9% strain) have been limited to net shapes (solid and tubular cylinders) produced during formation of the crystal. However, if heating and quenching take place in a very short time (fraction of a second) the precipitation does not progress far enough to cause significant change in the composition and the hyperelastic properties can be retained. These discoveries by the present inventors enable a variety of methods for shape-setting single crystal SMAs. Extruded shapes may be bent, elongated with reduction of diameter, and tubular as well as solid crystal shapes may be re-formed. These novel methods extend the usefulness of single crystal SMA by removing a limitation on shapes.

Single crystals pulled from melt have an as-formed or extruded shape such as a solid or hollow cylindrical shape with a constant cross-sectional form. It is sometimes advantageous to alter the fabricated shape into a shape more suited to a particular application. One such application is for use as eyeglass frame hinge flexures to replace hinges or to replace the entire eyeglass frame. Another is to form curves in a guidewire to follow tortuous path in a blood vessel, or a sieve placed in a blood vessel for the purpose of retrieving and removing a blood clot. The various embodiments of the present invention provides processes for "shape-setting" CuAlNi or other single-crystal materials.

CuAlNi single crystal is in a metastable condition and gradually deteriorates to polycrystalline form. The rate of decomposition is temperature dependent. At room temperature the rate is sufficiently low that negligible change takes place over years. At 300-400 deg. C. the rate is rapid enough that degeneration to multiple crystals may occur in a few seconds. Once formed, the multiple crystals do not re-form as a single crystal: this requires melting and special processing. However, CuAlNi may retain its single crystal condition through repeated heating to annealing temperature and rapid cooling. At sufficiently high temperature (typically 850-950 deg. C.) the three components Cu, Al, and Ni are in solution. CuAlNi's hyperelastic properties are exhibited within a very narrow range of compositions. If cooling is not sufficiently rapid, Al precipitates form, changing the composition and drastically altering thermo-mechanical properties.

The crucial insight leading to the present invention is that a combination of annealing, constrained shaping, and quenching leads to an altered "remembered" shape.

Quenching, that is rapidly lowering the temperature from a temperature at which the three components Cu, Al, and Ni are in solution, is conventionally used to "freeze in" the composition by not permitting elemental components from forming precipitates. If cooling takes place slowly these precipitates remove atoms from the crystal lattice and modify it in such a way as to destroy the phase transformation that leads to the shape memory effect. Rapid cooling preserves the integrity of the solution.

Composition can be altered during heating and cooling cycles by the fact that Al at the surface forms aluminum oxide, and the oxide, being insoluble, is effectively removed from the material. Reducing the Al content by 0.1%, which increases the phase transformation temperature, may alter the transition point enough to make the material useless.

It is a common characteristic of metals that there is a temperature range below the melting point within which internal stresses are minimal. Such an 'annealed' material can be deformed far beyond its natural limits without breaking, and the deformed shape is retained after cooling.

The annealing temperature of CuAlNi single crystal alloy is about 600 deg. C. When heated to this temperature its shape may be drastically changed with very small applied forces. When cooled, the material retains the modified shape, and if it is rapidly cooled it also retains its shape memory qualities.

To shape-set a portion of elongated component of CuAlNi it is important that heating and cooling both be very rapid. Otherwise the material in the heat-affected zone adjacent to the heated portion may undergo precipitation, resulting in an altered composition, or it may form multiple crystals because of critical stress. Polycrystalline alloys have far less strain tolerance and recovery, so are much inferior in performance compared to single crystals.

If the objective is to make a bend in, for example, a wire, then it is necessary either to heat all of the wire uniformly or the heating and cooling must be done quickly.

Otherwise the wire in the heat-affected zone between the heated segment and the un-heated segment will be held at an intermediate temperature, above ambient but below the annealing temperature. In this intermediate temperature range the CuAlNi single crystal is unstable and will degenerate rapidly to polycrystal form and be quite brittle.

Rapid cooling is satisfactorily performed by submersion in salt water. Rapid heating is not as readily accomplished. Several methods are demonstrable: each has advantages and disadvantages.

Rapid heating can be accomplished by immersing the object to be shape-set in a very hot flame such as provided by an oxy-acetylene torch. The sample is held in the flame while it transforms and becomes straight, begins to glow, and then anneals. The sample is then quickly removed from the flame and, while constrained in the desired shape, it is plunged into salt water. Salt water is used because a layer of bubbles does not form to insulate the surface of the material.

Another method is to constrain the shape of the wire to the desired shape in a mold, heat the mold, and quench. Quench must be relatively fast, but in this case the specimen may be held at an elevated temperature (850-950 deg. C.) for as long as is convenient.

For example, a CuAlNi wire is inserted in a stainless steel tube. The tube is heated to its annealing temperature (about 850 deg. C.) and shaped by bending. Several bends may be incorporated. After bending, the tube is uniformly heated in an oven to 650-750 deg. C. to anneal the CuAlNi, then quickly quenched. The CuAlNi wire when removed from the stainless steel tube retains the modified shape: it has been shape-set.

A variation of this method is first to form a stainless steel tube into the shape desired, for example by heating segments in an acetylene flame and bending. After the tube is formed the CuAlNi wire is inserted into it at room temperature, and the tube with wire inside are heated and quenched. In this case it is important not to deform the CuAlNi too much as it may form multiple crystals. Re-crystallization occurs rapidly if CuAlNi is overstressed.

CuAlNi contained within a stainless steel tube is not ideal for rapid cooling. Cooling rate may be significantly enhanced by forming a number of holes in the tube to allow contact with the water and to reduce the insulating effect of air trapped within the tube.

Samples of hyperelastic CuAlNi heated to 950 deg. C. in stainless steel tube and cooled by immersion in salt water have been found to be martensitic although shape-setting has taken place. The transition temperature may be reduced by re-heating the sample without the stainless steel mold and quenching it bare.

If deformation takes place prior to heating, strain must be limited to the plateau, about 9%, so as not to re-crystallize. If the sample is heated to near melting, then deformed and quenched, much larger deformations are tolerated.

Stainless steel is used to constrain the deformed hyperelastic wire because the annealing temperature of stainless steel is higher than the temperature at which CuAlNi softens and becomes easily deformed. During heating, as the plateau stress of the hyperelastic material increases, the hyperelastic material exerts a great force. If a copper tube is used, its walls must be thick compared to the diameter of the hyperelastic. Otherwise, the force of the hyperelastic material shape recovery may cause the Cu tube to (partially) straighten because Cu anneals at a temperature lower than the softening temperature of hyperelastic material.

Another method is to heat the material by a laser beam or by an infrared heater. The beam may be moved onto the sample or vice versa. The technique works better if two beams are used, one on each surface. Quenching may be by spraying or dousing with salt water or other heat absorber.

Another method of rapid heating is by joule heating. A pulse of electrical energy is directed such that it is dissipated in the material, heating it to near incandescence. If heating is very rapid the material may be immersed during the heating phase, so that at the end of the joule heating pulse it immediately cools. Otherwise the sample may be moved so that it is immersed, or doused or sprayed with cold liquid.

The joule heating method is not limited to materials of small diameter. However, it is difficult to deliver the electrical energy into the CuAlNi as it is a very good electrical conductor (resistivity is of the order of 30 microhm cm. Pure copper is 1.5 microhm cm.)

Still another method of heating is by induction heating.

These methods work best on material samples that are small in one dimension such as thin foils or fine wires.

Example of One Preferred Embodiment

A 1 mm diameter CuAlNi straight hyperelastic wire having a transition temperature at +10 deg. C was held in a curved shape with two pairs of pliers while being placed in an oxy-acetylene flame for approximately 3 seconds. The wire stiffened and straightened as it was heated, then softened and bent to a radius of about 5 mm. It was rapidly cooled by immersion in a pan of room-temperature salt water. After this procedure the wire retained a curvature of about 5 mm under no external stress, and returned to this shape after being straightened. This degree of curvature corresponds to a strain of approximately 10%, which compares favorably with the hyperelastic properties of the untreated wire, but with an altered shape.

Device Embodiments of the Invention

One appropriate application is as a flexure to replace hinges in eyeglasses. A strip of CuAlNi is shape-set so that it is bent at a right angle. One end is attached to the frame, the other is attached to the temple piece of the glasses. A cam or eccentric may be included to provide two stable positions: with the glasses worn on the face, or with the glasses folded for transport or storage. Alternatively the entire glasses frame may be fabricated of CuAlNi single crystal wire by appropriate shape-setting.

Figure 1:
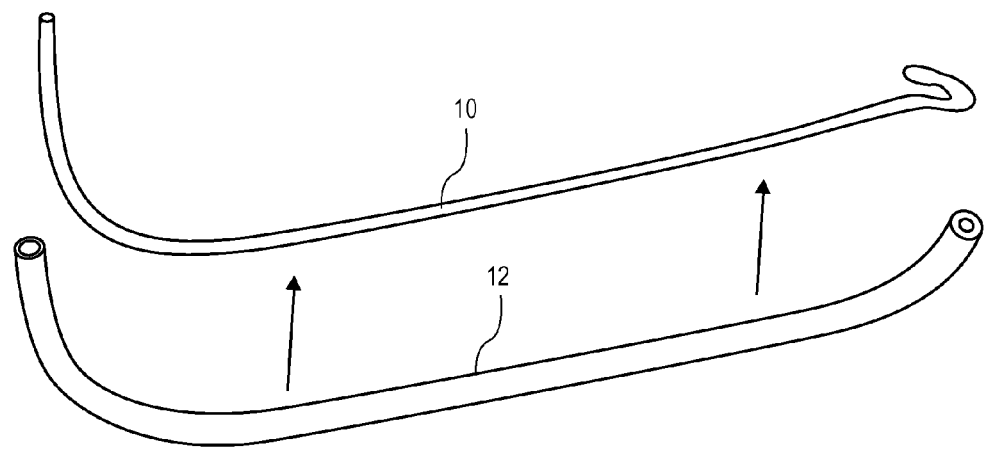
FIG. 1 is a side elevation view showing a hyperelastic wire superimposed over a steel mold used to form the wire.

As shown in FIG. 1, a hyperelastic wire 10 can be made in the desired shape by forming with the steps described above the wire within a tubular steel mold 12 which generally conforms to the wire shape.

The invention claimed is:

1. A method of shape-setting a device so that it is comprised of a single crystal shape memory alloy, the method comprising the steps of heating the device to a first temperature sufficient for annealing the alloy, forming the device into a shape, constraining the device while in the shape, heating the device to a second temperature and within a first time period with the second temperature and first time period being sufficient to cause the alloy to lose its strength, and cooling the device to a third temperature and within a second time period with the third temperature and second time period being sufficient to cause the alloy to form a single crystal.

2. A method as in claim 1 in which the forming step is carried out by forming the shape of device into a wire shape, providing a tube which generally conforms to the shape of the wire, and inserting the wire into the tube.

3. A method as in claim 2 in which the step of providing a tube comprises providing a tube of stainless steel.

4. A method of shape-setting a device so that it is comprised of a single crystal shape memory alloy, the method comprising the steps of:

heating the device to an annealing temperature sufficient for annealing the alloy, wherein the device comprises a single crystal shape memory alloy;
forming the device into a shape;
constraining the device while in the shape and holding the device in the shape for a first time period sufficient to cause the alloy to lose its strength; and
cooling the device to a cooling temperature for a second time period, wherein the cooling temperature and second time period are sufficient to cause the alloy to remain a single crystal in the shape.

5. A method of shape-setting a device so that it is comprised of a single crystal shape memory alloy of CuAlNi, the method comprising the steps of:

heating the device to a first temperature sufficient for placing the Cu, Al and Ni in solution;
rapidly quenching the device to a second temperature to prevent precipitation of the Cu, Al and Ni so that the device remains as a single crystal of CuAlNi;
forming the device into a shape;
constraining the device while in the shape;
heating the device to a third temperature for a first time period, wherein the third temperature and first time period are sufficient to cause the alloy to lose its strength; and
cooling the device to a fourth temperature for a second time period, wherein the fourth temperature and second time period are sufficient to cause the alloy to remain a single crystal in the shape.

* * * * *

UNITED STATES PATENT AND TRADEMARK OFFICE
CERTIFICATE OF CORRECTION

| | | |
|---|---|---|
| PATENT NO. | : 7,842,143 B2 | Page 1 of 1 |
| APPLICATION NO. | : 11/949663 | |
| DATED | : November 30, 2010 | |
| INVENTOR(S) | : Alfred David Johnson et al. | |

It is certified that error appears in the above-identified patent and that said Letters Patent is hereby corrected as shown below:

Column 1, line 3; insert:

--STATEMENT AS TO FEDERALLY SPONSORED RESEARCH
This invention was made with Government support under Contract No. W31P4Q-05-C-0158 awarded by DARPA. The Government has certain rights in the invention.--

Signed and Sealed this

Seventeenth Day of May, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,842,143 B2 | Page 1 of 1 |
| APPLICATION NO. | : 11/949663 | |
| DATED | : November 30, 2010 | |
| INVENTOR(S) | : Alfred David Johnson et al. | |

It is certified that error appears in the above-identified patent and that said Letters Patent is hereby corrected as shown below:

In the Specification

In Col. 1, line 59, "10/588,412 filed Jul. 31, 2006," should read --10/588,413 filed Jul. 31, 2006,--.

Signed and Sealed this
Twenty-fifth Day of August, 2015

Michelle K. Lee
*Director of the United States Patent and Trademark Office*